United States Patent
Wang et al.

(10) Patent No.: US 9,112,025 B2
(45) Date of Patent: Aug. 18, 2015

(54) LDMOS DEVICE AND FABRICATION METHOD

(71) Applicants: Semiconductor Manufacturing International (Beijing) Corporation, Beijing (CN); Semiconductor Manufacturing International (Shanghai) Corporation, Shanghai (CN)

(72) Inventors: Gangning Wang, Shanghai (CN); Chih-Chung Tai, Shanghai (CH); Guangli Yang, Shanghai (CN); Jiwei He, Shanghai (CN); Xianyong Pu, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/247,496

(22) Filed: Apr. 8, 2014

(65) Prior Publication Data
US 2015/0041893 A1 Feb. 12, 2015

(30) Foreign Application Priority Data
Aug. 7, 2013 (CN) .......................... 2013 1 0341827

(51) Int. Cl.
*H01L 21/311* (2006.01)
*H01L 29/78* (2006.01)
*H01L 29/66* (2006.01)

(52) U.S. Cl.
CPC ...... *H01L 29/7816* (2013.01); *H01L 29/66681* (2013.01)

(58) Field of Classification Search
CPC . H01L 21/38; H01L 21/762; H01L 21/76205; H01L 21/76224; H01L 21/76202; H01L 21/31658; H01L 21/02107; H01L 21/045; H01L 27/0922; H01L 29/0852; H01L 31/035254; H01L 29/66681; H01L 29/7816
USPC ......... 438/700, 197, 217, 218, 220, 221, 225, 438/289, 297, 301, 376, 369, 508, 510, 514, 438/672, 723, 724, 786; 257/E21.006, 257/E21.055, E21.092, E21.126, E21.127, 257/E21.144, E21.158, E21.182, E21.247, 257/E21.248, E21.267, E21.277, E21.278, 257/E21.293, E21.42, E21.421, E21.423, 257/E21.435, E21.545, E21.55, E21.564, 257/E21.577
See application file for complete search history.

(56) References Cited

U.S. PATENT DOCUMENTS

| | | | | |
|---|---|---|---|---|
| 7,683,452 B2 * | 3/2010 | Ohkawa et al. | ................ | 257/459 |
| 7,868,422 B2 * | 1/2011 | Lee et al. | ........................ | 257/544 |
| 8,003,424 B2 * | 8/2011 | Lee et al. | ........................ | 438/447 |
| 8,791,512 B2 * | 7/2014 | Roy et al. | ........................ | 257/291 |
| 8,890,243 B2 * | 11/2014 | Yanagi | ........................... | 257/337 |

* cited by examiner

*Primary Examiner* — David Nhu
(74) *Attorney, Agent, or Firm* — Anova Law Group, PLLC

(57) ABSTRACT

Various embodiments provide LDMOS devices and fabrication methods. An N-type buried isolation region is provided in a P-type substrate. A P-type epitaxial layer including a first region and a second region is formed over the P-type substrate. The first region is positioned above the N-type buried isolation region, and the second region surrounds the first region. An annular groove is formed in the second region to surround the first region and to expose a surface of the N-type buried isolation region. Isolation layers are formed on both sidewalls of the annular groove. An annular conductive plug is formed in the annular groove between the isolation layers. The annular conductive plug is in contact with the N-type buried isolation region at the bottom of the annular conductive plug. A gate structure of an LDMOS transistor is formed over the first region of the P-type epitaxial layer.

20 Claims, 5 Drawing Sheets

LDMOS DEVICE AND FABRICATION METHOD

CROSS-REFERENCES TO RELATED APPLICATIONS

This application claims priority to Chinese Patent Application No. CN201310341827.4, filed on Aug. 7, 2013, the entire contents of which are incorporated herein by reference.

FIELD OF THE DISCLOSURE

The present disclosure relates to the field of semiconductor manufacturing technology and, more particularly, relates to LDMOS devices and their fabrication methods.

BACKGROUND

Metal-oxide-semiconductor field-effect transistor (MOSFET) may include vertical double-diffused MOSFET and lateral double-diffused MOSFET. Comparing to the vertical double-diffused MOSFET, the lateral double-diffused MOSFET has many more advantages, including better thermal stability and frequency stability, higher gain and durability, lower feedback capacitance and thermal resistance and constant input impedance, and simpler biasing circuit.

FIG. 1 depicts a conventional N-type LDMOS transistor. The conventional N-type LDMOS transistor includes a semiconductor substrate (not illustrated), a P-well 100 in the semiconductor substrate, an N-type drift region 101, and a STI structure 104 in the N-type drift region 101. The STI structure 104 is used to increase the conduction path of the LDMOS transistor to increase breakdown voltage of the LDMOS transistor. The conventional N-type LDMOS transistor also includes a gate 105 formed on the semiconductor substrate. The gate 105 is formed cross over the P-well and the N-type drift region 101 and is partially located on the STI structure 104. The conventional N-type LDMOS transistor also includes an N-doped source region 102 in the P-well and an N-doped drain region 103 in the N-type drift region. The N-doped source region 102 and N-doped drain region 103 are formed on both sides of the gate 105.

However, it is desirable to improve isolation performance between the LDMOS transistor and other semiconductor devices, and also between the LDMOS transistor and the semiconductor substrate.

BRIEF SUMMARY OF THE DISCLOSURE

One aspect or embodiment of the present disclosure includes a method for forming an LDMOS device. An N-type buried isolation region is provided in a P-type substrate. A P-type epitaxial layer is formed over the P-type substrate, the P-type epitaxial layer including a first region and a second region. The first region is positioned above the N-type buried isolation region, and the second region surrounds the first region. An annular groove is formed in the second region of the P-type epitaxial layer. The annular groove surrounds the first region of the P-type epitaxial layer and exposes a surface of the N-type buried isolation region at a bottom of the annular groove. Isolation layers are formed on both sidewalls of the annular groove. An annular conductive plug is formed in the annular groove between the isolation layers. The annular conductive plug is in contact with the N-type buried isolation region at the bottom of the annular conductive plug. A gate structure of an LDMOS transistor is formed over the first region of the P-type epitaxial layer.

One aspect or embodiment of the present disclosure also includes an LDMOS device. The LDMOS device includes a P-type substrate, an N-type buried isolation region, a P-type epitaxial layer, isolation layers, an annular conductive plug, and/or a gate structure of an LDMOS transistor. The N-type buried isolation region is disposed in the P-type substrate. The P-type epitaxial layer is disposed over the P-type substrate, the P-type epitaxial layer including a first region and a second region. The first region is positioned above the N-type buried isolation region, and the second region surrounds the first region. The second region of the P-type epitaxial layer includes an annular groove surrounding the first region of the P-type epitaxial layer and exposing a surface of the N-type buried isolation region at a bottom of the annular groove. The isolation layers are disposed on both sidewalls of the annular groove. The annular conductive plug is in the annular groove between the isolation layers and is in contact with the N-type buried isolation region at the bottom of the annular conductive plug. The gate structure of the LDMOS transistor is disposed over the first region of the P-type epitaxial layer.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. For illustration purposes, the schematic drawings may be not to scale. The schematic drawings are solely illustrative, and should not limit the scope of the present disclosure. In addition, three-dimensional scales of length, width and depth should be included in practical fabrication process.

Figure 1:
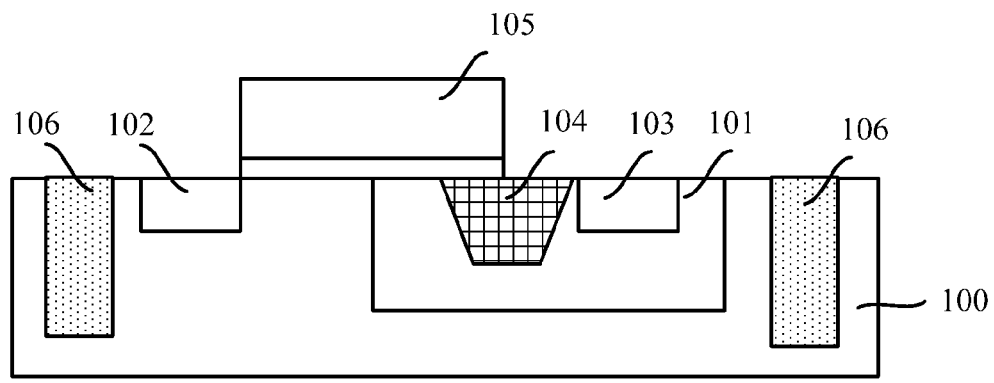
FIG. 1 depicts a conventional LDMOS transistor.

LDMOS transistors are power devices and thus, when in operation, high voltages have to be applied thereto. To ensure proper functioning of other low voltage devices formed on the semiconductor substrate, an LDMOS transistor needs to be isolated from other devices on the semiconductor substrate. As shown in FIG. 1, current isolation techniques often include forming an N-type isolation ring 106 in the P-well 100 by ion implantation. A positive voltage may be applied to the N-type isolation ring 106 to reverse bias between the N-type isolation ring 106 and the P-well 100 such that the LDMOS transistor can be cut off from its surrounding devices and to prevent adverse effect of a heavy current lateral diffusion under high voltages on the surrounding devices.

To ensure the isolation effect, the N-type isolation ring 106 needs to be deeply and heavily doped with a high doping depth and a high doping concentration. However, the N-type isolation ring 106 is formed by ion implantation. When ions are doped with depth to certain extent, the ion implantation process can hardly provide desired doping concentration. Consequently, the width of the N-type isolation ring 106 has to be dramatically increased to assure desired isolation effect.

The N-type isolation ring 106 then takes up a large area on the semiconductor substrate, which is detrimental to improving degree of integration of the formed device. Additionally, the N-type isolation ring 106 may have effective isolation in a lateral direction, but may have significantly-limited isolation effect in a vertical direction.

Disclosed herein provides LDMOS devices and methods for forming the LDMOS. An exemplary LDMOS device can include an isolation structure including an annular conductive plug, an isolation layer, and an N-type buried isolation region to realize great horizontal and vertical isolation between the LDMOS transistor and other devices formed on/in the substrate. Moreover, the use of the annular conductive plug and isolation layer allows the formed device to have a relatively small volume.

Figure 8:
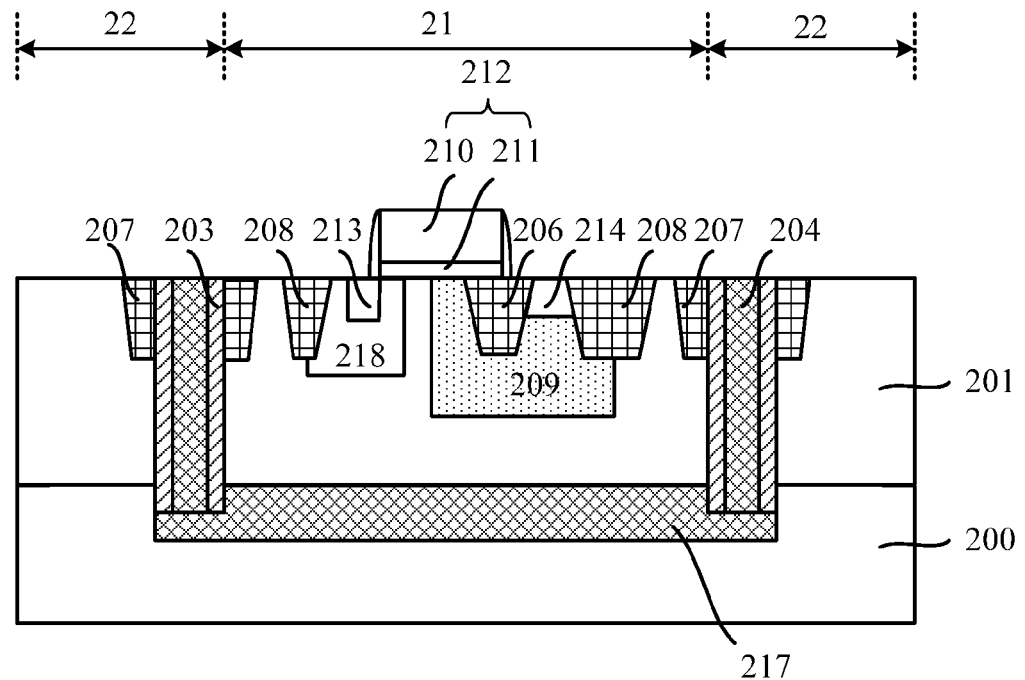
Figure 9:
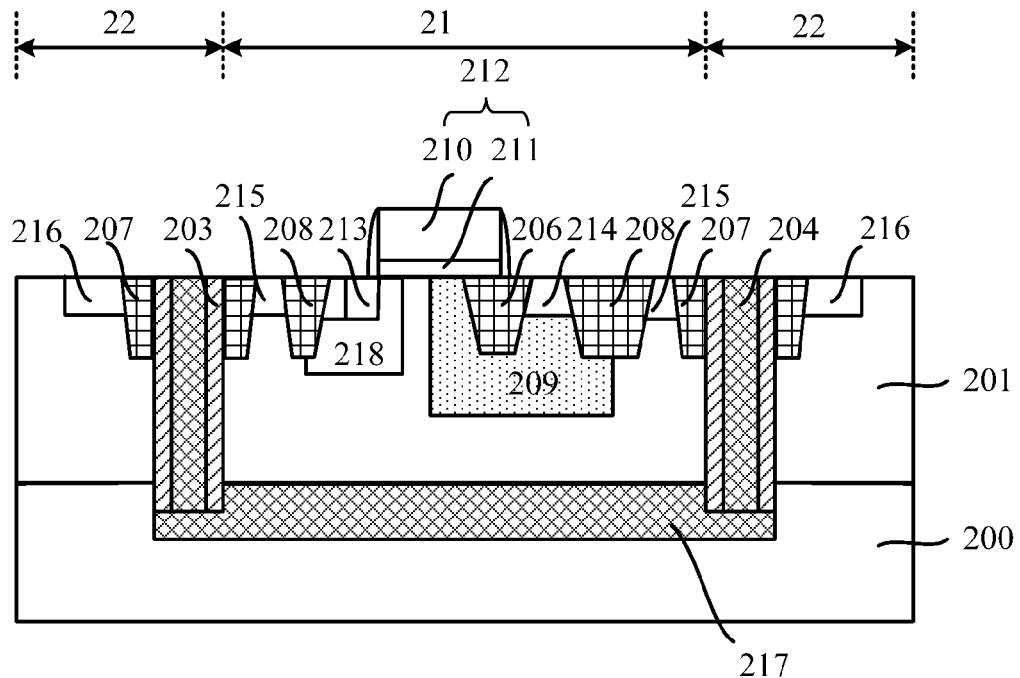
Figure 10:
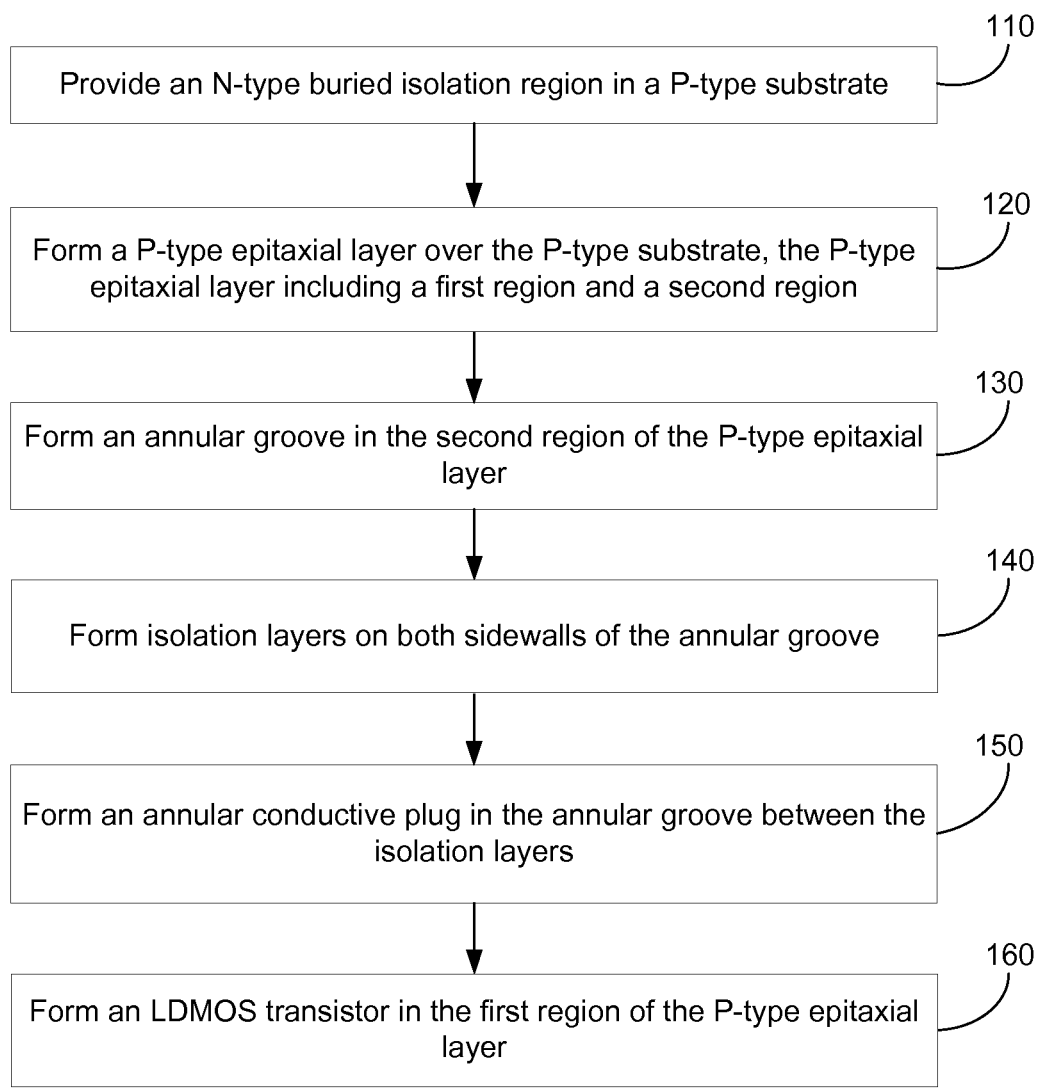
FIG. 10 depicts an exemplary method for forming an LDMOS device consistent with various disclosed embodiments.

FIGS. 2-9 depict an exemplary LDMOS device at various stages during its formation, and FIG. 10 depicts an exemplary method for forming an LDMOS device consistent with various disclosed embodiments.

Figure 2:
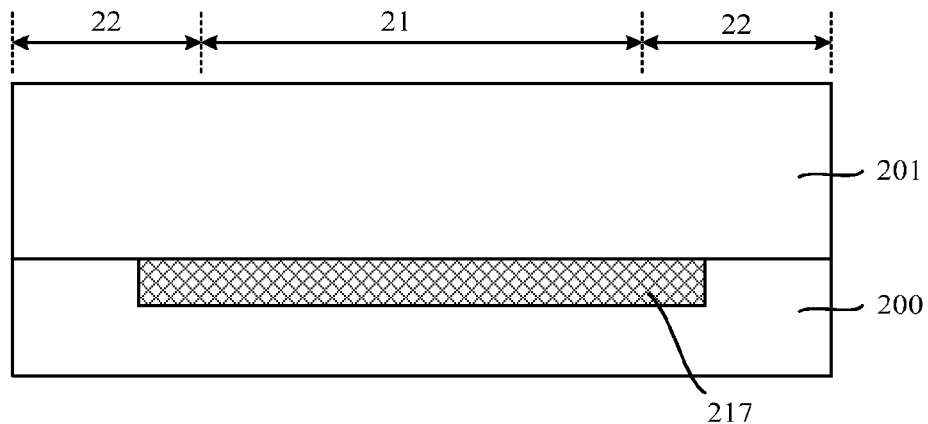
FIGS. 2-9 depict an exemplary LDMOS device at various stages during its formation consistent with various disclosed embodiments.

Referring to FIG. 2, a P-type substrate 200 is provided. An N-type buried isolation region 217 is formed in the P-type substrate 200 (e.g., in Step 110 of FIG. 10). In one embodiment, the N-type buried isolation region 217 may have a top surface flushed with the top surface of the P-type substrate 200. A P-type epitaxial layer 201 is formed on the P-type substrate 200 and includes a first region 21 and a second region 22 (e.g., in Step 120 of FIG. 10). The first region 21 is positioned above the N-type buried isolation region 217, while the second region 22 surrounds the first region 21.

The material of the P-type substrate 200 can be Si, Ge, GeSi, SiC or other suitable semiconductor materials. In one embodiment, the P-type substrate 200 is Si. The P-type substrate 200 can be doped with P-type impurity ions. The P-type impurity ions can include boron ions, gallium ions, indium ions, or combinations thereof.

The N-type buried isolation region 217 formed in the P-type substrate 200 can be used to vertically isolate the subsequently-formed LDMOS transistor from the P-type substrate 200. When the LDMOS transistor is in operation, a positive voltage can be applied to the N-type buried isolation region 217. The PN junction between the N-type buried isolation region 217 and the P-type substrate 200 is thus reversely biased to achieve isolation between the N-type buried isolation region 217 and the P-type substrate 200.

The N-type buried isolation region 217 is formed by implanting N-type ions into the P-type substrate 200. The N-type ions can include phosphorus ions, arsenic ions, antimony ions, or combinations thereof. The concentration of impurity ions in the N-type buried isolation region 217 is sufficiently high, so that the PN junction between the N-type buried isolation region 217 and the P-type substrate 200 can be easily reversely biased with great junction depth to improve vertical isolation of the device shown in FIG. 1. For example, the impurity ions can have a concentration ranging from about 1E18 atom/cm$^3$ to about 1E22 atom/cm$^3$, such as from about 1E18 atom/cm$^3$ to about 2E21 atom/cm$^3$, including about 1E19 atom/cm$^3$, about 2E19 atom/cm$^3$, about 1E20 atom/cm$^3$, about 9E20 atom/cm$^3$, in the N-type buried isolation region 217.

The P-type epitaxial layer 201 formed on the P-type substrate 200 can include the first region 21 and the second region 22 surrounding the first region 21. For example, the first region 21 can be located in the center while the second region 22 can be located on the edge. The first region 21 can be positioned exactly above the N-type buried isolation region 217 having an area less or slightly less than an area of the N-type buried isolation region 217. An LDMOS transistor can be subsequently formed in the first region 21 of the P-type epitaxial layer 201, and an annular isolation structure (e.g., including isolation layers and an annular conductive plug) can be subsequently formed in the second region 22 of the P-type epitaxial layer 201.

The P-type epitaxial layer 201 can be formed by an epitaxial process. During the epitaxial process, P-type impurity ions can be in-situ doped into the epitaxial layer. The P-type impurity ions can be boron ions, gallium ions, indium ions or combinations thereof. The P-type epitaxial layer 201 and the P-type substrate 200 can be made of same or different materials. In one embodiment, the P-type epitaxial layer 201 is made of Si.

Figure 3:
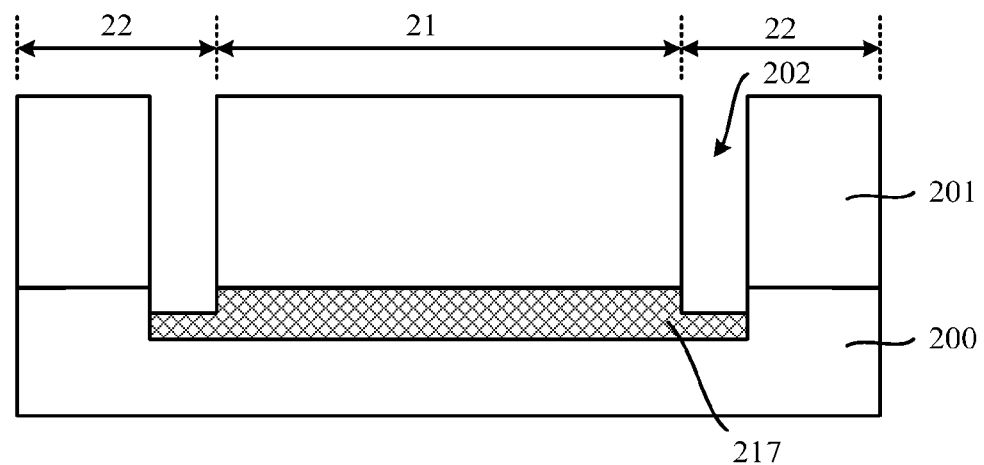

Referring to FIG. 3, an annular groove 202 is formed in the second region 22 of the P-type epitaxial layer 201 (e.g., in Step 130 of FIG. 10). The annular groove 202 can be formed surrounding or bordering the first region 21 of the P-type epitaxial layer 201. The annular groove 202 can have a bottom to expose a surface of the N-type buried isolation region 217 in the P-type substrate 200.

The annular groove 202 can be formed by, e.g., firstly, forming a mask layer (not illustrated) on the P-type epitaxial layer 201. The mask layer can have an opening to expose the surface of the P-type epitaxial layer 201. The opening can have a position and a width corresponding to the annular groove 202 to be formed. The annular groove 202 can be formed in the P-type epitaxial layer 201 by etching the P-type epitaxial layer 201 along the annular groove 202.

The P-type epitaxial layer 201 can be etched by, e.g., a dry etching process such as a plasma etching process using chlorine-containing or bromine-containing gas or a mixture thereof.

Isolation layers can be formed on the sidewalls of the annular groove 202. The isolation layers can be used to laterally, electrically isolate the LDMOS transistor formed in the first region 21 from other devices formed outside of the first region 21 in the P-type epitaxial layer 201. An annular conductive plug is subsequently formed to fill up the annular groove 202 by conductive material(s). The bottom of the annular conductive plug can be in contact with the underlying N-type buried isolation region 217. A positive voltage can then applied to the N-type buried isolation region 217 through the annular conductive plug to reversely bias the PN junction between the N-type buried isolation region 217 and the P-type substrate 200. The vertical isolation between the LDMOS transistor and the P-type substrate 200 can be realized.

In one embodiment, a portion of the annular groove 202 is located in the N-type buried isolation region 217. That is because after etching the P-type epitaxial layer 201. For example, an over-etching is implemented when etching the N-type buried isolation region 217 to form the annular groove 202. Such over-etching can increase depth of the annular groove 202 into the N-type buried isolation region 217. Therefore when the annular groove 202 is filling up with the conductive material(s), the generated annular conductive plug can fully contact the N-type buried isolation region 217. This can avoid the poor contact between the two surfaces of the N-type buried isolation region 217 and the annular conductive plug in the annular groove 202.

The annular groove 202 can have a depth portion formed in the N-type buried isolation region 217 of about 0.5 micrometer to about 1 micrometer, in order to maximize contact effect between the annular conductive plug to be formed in the annular groove 202 and the N-type buried isolation region 217.

The annular groove 202 can have a total depth of about 3.5 micrometers to about 5.5 micrometers and a width of about 0.6 micrometer to about 1.2 micrometers. Comparing to conventional method of using PN junctions for lateral isolations, the disclosed use of a lateral isolation structure including an annular conductive plug and isolation layer(s) in the annular groove 202 can provide a much smaller device size. This can improve the degree of integration of the formed devices.

Figure 4:
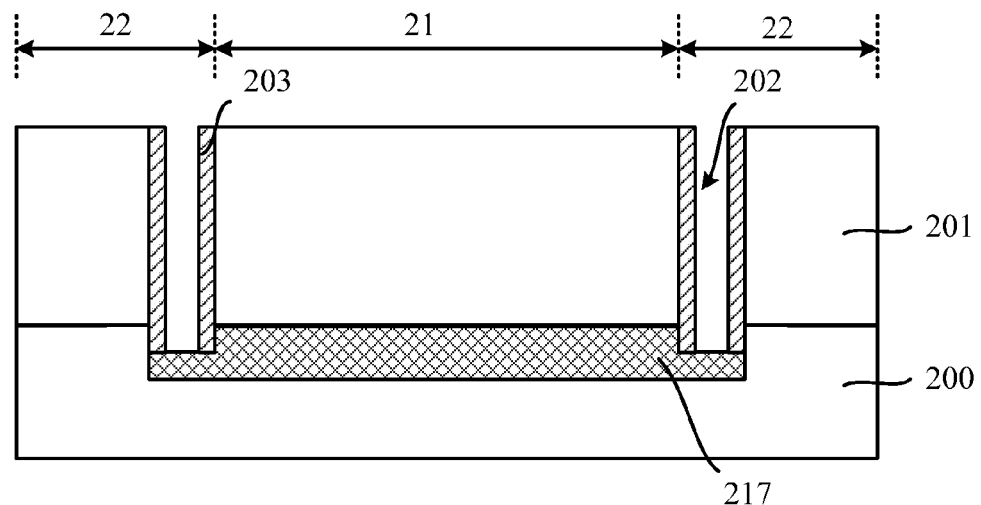

Referring to FIG. 4, isolation layers 203 are formed on sidewalls of the annular groove 202 (e.g., in Step 140 of FIG. 10).

As the isolation layers 203 are formed on both sidewalls of the annular groove 202, the isolation layers 203 can also surround or border the first region 21 of the P-type epitaxial layer 201. The isolation layers 203 can realize the lateral isolation between the LDMOS transistor subsequently formed in the first region 21 and other devices formed outside of the first region 21.

The thickness of the isolation layers 203 can be about 500 Å to about 3000 Å. The isolation layers 203 can be made of a material including, e.g., $SiO_2$, SiN, SiON, SiCN, SiC, or a combination thereof. In this manner, the isolation layers can have a small volume and can provide desired isolation effect when the LDMOS transistor is operated under high voltages.

The isolation layers 203 can be a single layer or a multilayer stacked structure. The isolation layers 203 can be formed by, e.g., using a deposition process to form an isolation material layer on sidewalls and surfaces of the annular groove 202 and on the P-type epitaxial layer 201. The isolation material layer can then be etched by a maskless etching to form the isolation layers 203 on the sidewalls of the annular groove 202 as shown in FIG. 4.

Figure 5:
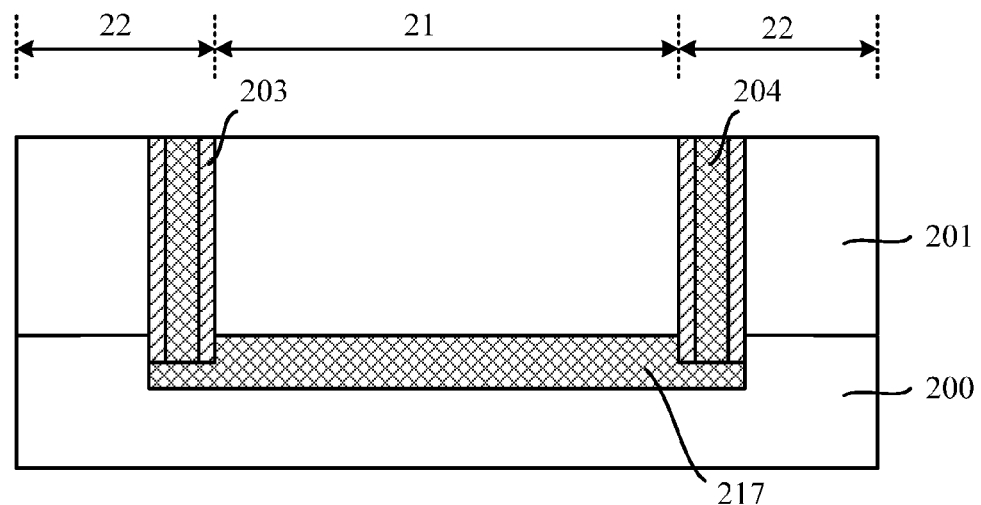

Referring to FIG. 5, an annular conductive plug 204 is formed in the annular groove 202 between the isolation layers 203 on sidewalls of the annular groove 202 (e.g., in Step 150 of FIG. 10). The bottom of the annular conductive plug 204 can be in contact with the N-type buried isolation region 217.

The annular conductive plug 204 can be electrically connected to the N-type buried isolation region 217. A positive voltage can be applied to the N-type buried isolation region 217 through the annular conductive plug 204 such that the PN junction between the N-type buried isolation region 217 and the P-type substrate 200 can be reversely biased. This can provide vertical isolation between the subsequently-formed LDMOS transistor and the P-type substrate 200 to avoid effect of the high voltage and the high current generated by an operating LDMOS transistor on other semiconductor devices formed outside of the first region 201 in the P-type substrate 200 via the P-type substrate 200.

The annular conductive plug 204 can be made of a material including polysilicon. Use of polysilicon can prevent the metal ion contamination during an early process including the device manufacturing process to improve the performances of the LDMOS transistor and other semiconductor devices.

The exemplary polysilicon can be doped with high concentration of N-type impurity ions, so that the annular conductive plug 204 has a low resistance and have an increased efficiency for absorbing carriers to effectively prevent crosstalk noises.

Exemplary N-type impurity ions can include phosphorus ions, arsenic ions, antimony ions, or combinations thereof. The concentration of the N-type impurity ions in the exemplary polysilicon can be about 1E19 atom/cm$^3$ to about 5E20 atom/cm$^3$.

The annular conductive plug 204 can be formed by, e.g., forming a conductive material layer (not illustrated) on surface of the P-type epitaxial layer 201 and in the annular groove 202 to fill up the annular groove 202. When forming the conductive material layer, N-type ions can be in-situ doped in the conductive material layer. The conductive material layer can then be planarized so as to expose the surface of the P-type epitaxial layer 201. Remaining conductive material layer in the annular groove 202 can form the annular conductive plug 204 in the annular groove 202.

Figure 6:
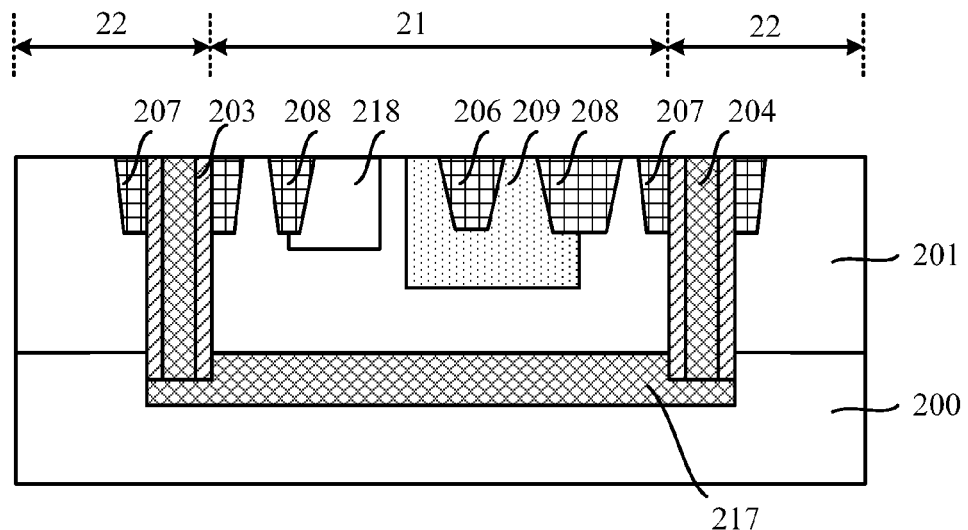

Referring to FIG. 6, a first shallow trench isolation (STI) structure 206 and a second STI structure 208 are formed in the first region 21 of the P-type epitaxial layer 201. An annular STI structure 207 is formed on both sides of the isolation layers 203 in the annular groove 202.

The first STI structure 206, as a part of the LDMOS transistor to be formed later, can be used to increase a path length of a source-drain circuit generated between the source region and the drain region.

The second STI structure 208 can be used for the isolation between the subsequently formed body doped ring and the source/drain regions of the LDMOS transistor in the first region 21.

The annular STI structure 207 can be formed on both sides of the isolation layers 203 and surrounding the isolation layers 203 such that the upper portions of the isolation layers 203 and the annular conductive plug 204 (or the annular groove 202) pass through the annular STI structure 207 to isolate the annular conductive plug 204 from the P-type epitaxial layer 201. This can prevent, when a high voltage is applied to the annular conductive plug 204, leakage current from the surface of the annular conductive plug 204 to the P-type epitaxial layer 201 to vary the electrical potential of the P-type epitaxial layer 201.

The first STI structure 206, the second STI structure 208, and the annular STI structure 207 can be made of same or different materials, for example, including $SiO_2$, SiN, SiON, SiCN, SiC, or a combination thereof. The first STI structure 206, the second STI structure 208, and the annular STI structure 207 do not contact each other.

The first STI structure 206, the second STI structure 208, and the annular STI structure 207 can be formed by, e.g., forming a first trench and a second trench (not illustrated) in the first region 21 and forming a third trench (not illustrated) in the second region 22. An isolation layer can then be formed on surface of the P-type epitaxial layer 201 and in the first, second, and third trenches to fill up the first, second, and third trenches. The isolation layer can then be planarized to expose the surface of the P-type epitaxial layer 201 with remaining isolation layers in the first trench to form the first STI structure 206, in the second trench to form the second STI structure 208, and in the third trench to form the annular STI structure 207.

In one embodiment, the first STI structure 206, the second STI structure 208, and the annular STI structure 207 can be formed after the formation of the annular groove 202 (as shown in FIG. 3).

In other embodiments, the first STI structure 206, the second STI structure 208, and the annular STI structure 207 can be formed before the formation of the annular groove 202. For example, after forming the P-type epitaxial layer 201 over the P-type substrate 200, the first STI structure 206, the second STI structure 208, and the annular STI structure 207 can be formed in the P-type epitaxial layer 201. Then, by etching the annular STI structure 207 and the P-type epitaxial layer 201 on the bottom of the annular STI structure 207, an annular groove 202 can be formed through the annular STI structure 207 and the P-type epitaxial layer 201. Such exemplary method can prevent damage to the isolation layer 203 formed on the sidewalls of the annular groove 202.

Still referring to FIG. 6, an N-type drift region 209 can be formed in the first region 21 of the P-type epitaxial layer 201 by ion implantation of N-type ions. The N-type drift region 209 can be a part of the LDMOS transistor to be formed. The first STI structure 206 can be totally inside of the N-type drift region 209, while the second STI structure 208 can be positioned partially inside the N-type drift region 209 as shown in FIG. 6.

A P-type body region 218 can be formed by ion implanting P-type ions in the P-type epitaxial layer 201 between another second STI structure 208 and the N-type drift region 209. The function of the P-type body region 218 is to adjust the threshold voltage of the subsequently-formed LDMOS transistor. A source of the LDMOS transistor can be subsequently formed in the P-type body region 218.

After implanting the N-type ions (and/or the P-type ions) to form the N-type drift region 209 (and/or the P-type body region 218), an annealing process can be conducted to activate the doped ions. The annealing process can take about 20 seconds to about 30 seconds at a temperature greater than about 1000° C.

Figure 7:
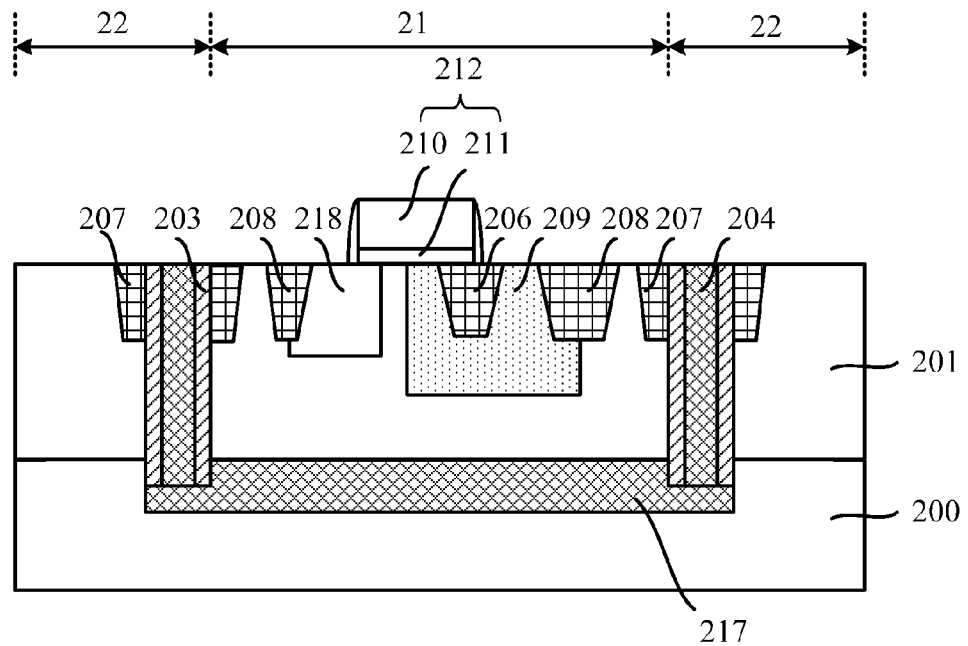

Referring to FIG. 7, a gate structure 212 is formed over the first region 21 of the P-type epitaxial layer 201. The gate structure 212 can cover portions of each of the P-type epitaxial layer 201, the P-type body region 218, the first STI structure 206, and the N-type drift region 209 (e.g., an area between the P-type epitaxial layer 201 and the first STI structure 206).

Referring to FIG. 8, a source region 213 is formed in the P-type epitaxial layer 201 (or in the P-type body region 218) on one side of the gate structure 212. A drain region 214 is formed in the N-type drift region 209 on the other side of the gate structure 212 (e.g., in Step 160 of FIG. 10).

The gate structure 212 can include a gate dielectric layer 211 formed on the P-type epitaxial layer 201, a gate electrode 210 formed on the gate dielectric layer 211, and sidewall spacers on sidewalls of both the gate dielectric layer 211 and the gate electrode 210.

In one embodiment, the gate dielectric layer 211 can be made of silicon oxide, while the gate electrode 210 can be made of polysilicon. In another embodiment, the gate dielectric layer 211 can be made of high-K dielectric materials, while the gate electrode 210 can be made of metal.

The sidewall spacers can include a single layer or a multilayer stacked structure. The source region 213 and the drain region 214 can be formed by ion implantation process. The implanted ions can be N-type ions.

As disclosed herein, an exemplary LDMOS transistor can include: the N-type drift region 209 formed in the first region 21 of the P-type epitaxial layer 201; the first STI structure 206 formed in the N-type drift region 209; the gate structure 212 formed on the first region 21 of the P-type epitaxial layer 201 to cover the P-type epitaxial layer 201, the first STI structure 206, and an area of the N-type drift region 209 between the P-type epitaxial layer 201 and the first STI structure 206; the source region 213 formed in the P-type epitaxial layer 201 on one side of the gate structure 212; and/or the drain region formed in the N-type drift region 209 on the other side of the gate structure 212.

Referring to FIG. 9, a body doped ring 215 is formed in the first region 21 of the P-type epitaxial layer 201, and an isolation ring 216 is formed in the second region 22 of the P-type epitaxial layer 201.

Both of the body doped ring 215 and the isolation ring 216 can be formed by an ion implantation process. The implanted ions can be P-type ions. The body doped ring 215 can be formed in the P-type epitaxial layer 201 and located between the annular STI structure 207 and one of second STI structures 208.

The body doped ring 215 can be electrically connected to a zero potential or a negative potential, so that the P-type epitaxial layer 201 is in the zero potential or the negative potential. In this manner, the electrical potential of the channel region under the gate structure 212 can be controlled and adjusted.

Various embodiments thus include an LDMOS device, e.g., as shown in FIG. 9. The LDMOS device can include: a P-type substrate 200 including an N-type buried isolation region 217 therein; and a P-type epitaxial layer 201 formed on the P-type substrate 200, the P-type epitaxial layer 201 including a first region 21 and a second region 22. The first region 21 can be located above the N-type buried isolation region 217, while the second region 22 can surround the first region 21.

The LDMOS device can also include an annular groove 202 formed in the second region 22 of the P-type epitaxial layer 201. The annular groove 202 can surround the first region 21 of the P-type epitaxial layer 201. The annular groove 202 can expose a surface of the N-type buried isolation region 217 at the bottom of the annular groove 202.

The annular groove 202 can include isolation layers 203 on both sidewalls of the annular groove 202, and an annular conductive plug 204 located between the isolation layers 203 and in the annular groove 202. The annular conductive plug 207 can be in contact with the underlying N-type buried isolation region 217. The LDMOS transistor can be thus located in the first region 21 of the P-type epitaxial layer 201.

The LDMOS transistor can further include: an N-type drift region 209 positioned in the first region 21 of the P-type epitaxial layer 201; a first STI structure 206 positioned in the N-type drift region 209; a gate structure 212 formed on the first region 21 of the P-type epitaxial layer 201 to cover a portion of the P-type epitaxial layer 201, a portion of the first STI structure 206, and an area of the N-type drift region 209 between the P-type epitaxial layer 201 and the first STI structure 206; a source region 213 located on one side of the gate structure 212 and in the P-type epitaxial layer 201; and/or a drain region 214 located on the other side of the gate structure 212 and in the N-type drift region 209.

The isolation layers 203 can have a thickness ranging from about 500 Å to about 3000 Å. The isolation layers 203 can be made of a material including $SiO_2$, SiN, SiON, SiCN, SiC, or a combination thereof.

The annular conductive plug 204 can be made of polysilicon. The exemplary polysilicon annular conductive plug can be doped with N-type ions having a concentration of about 1E19~5E20 atom/$cm^3$.

The annular groove 202 can have a depth ranging from about 3.5 micrometers to about 5.5 micrometers and a width ranging from about 0.6 micrometer to about 1.2 micrometers. A depth portion of the annular groove can be located in the N-type buried isolation region 217, the depth portion having a depth of about 0.5 micrometer to 1 micrometer.

The N-type buried isolation region 217 can include N-type impurity ions having a concentration ranging from about 1E18 atom/$cm^3$ to about 1E22 atom/$cm^3$. The annular STI structure 207 is located in the second region 22 of the P-type epitaxial layer 201. An upper portion of the annular groove 202 can pass through the annular STI structure 207.

The disclosed devices and methods provide desired isolation performance with reduced dimensions due to formation of the deep annular groove that is connected to an N-type buried isolation region in a P-type substrate for device isolation. Further, isolation layers on sidewalls of the deep annular groove that are connected to the N-type buried isolation region can be used for lateral isolation such that device size can be reduced. For example, a 40V LDMOS device can have a reduced area on a wafer, e.g., reduced by about 30% and greater. The deep annular groove having isolation layers thereon can turn the lateral isolation from a PN junction-based isolation to isolation-layer-based isolation. In addition, polysilicon can be used for the annular conductive plug to effectively absorb carriers.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming an LDMOS device, the method comprising:
   providing an N-type buried isolation region in a P-type substrate;
   forming a P-type epitaxial layer over the P-type substrate, the P-type epitaxial layer including a first region and a second region, wherein the first region is positioned above the N-type buried isolation region, and the second region surrounds the first region;
   forming an annular groove in the second region of the P-type epitaxial layer, wherein the annular groove surrounds the first region of the P-type epitaxial layer and exposes a surface of the N-type buried isolation region at a bottom of the annular groove;
   forming isolation layers on both sidewalls of the annular groove;
   forming an annular conductive plug in the annular groove between the isolation layers, wherein the annular conductive plug is in contact with the N-type buried isolation region at the bottom of the annular conductive plug; and
   forming a gate structure of an LDMOS transistor over the first region of the P-type epitaxial layer.

2. The method according to claim 1, wherein each of the isolation layers has a thickness ranging from about 500 Å to about 3000 Å.

3. The method according to claim 1, wherein the isolation layers are made of a material including $SiO_2$, SiN, SiON, SiCN, SiC, or a combination thereof.

4. The method according to claim 1, wherein the annular conductive plug is made of a material including polysilicon, wherein the polysilicon is a doped polysilicon.

5. The method according to claim 4, wherein the annular conductive plug is N-doped by N-type ions having a concentration of about $1E19$ atom/cm$^3$ to about $5E20$ atom/cm$^3$ in the annular conductive plug.

6. The method according to claim 1, wherein the annular groove has a depth ranging from about 3.5 micrometers to about 5.5 micrometers, and a width ranging from about 0.6 micrometer to about 1.2 micrometers.

7. The method according to claim 1, wherein the annular groove or the annular conductive plug has a depth portion located in the N-type buried isolation region.

8. The method according to claim 7, wherein the depth portion of the annular groove or the annular conductive plug located in the N-type buried isolation region ranges from about 0.5 micrometer to about 1.0 micrometer.

9. The method according to claim 1, further forming the N-type buried isolation region includes an ion implantation with N-type ions, the N-type ions having a concentration ranging from about $1E18$ atom/cm$^3$ to about $2E21$ atom/cm$^3$ in the N-type buried isolation region.

10. The method according to claim 1, further including:
    forming an annular shallow trench isolation (STI) structure in the P-type epitaxial layer on both sides of the annular groove such that the annular groove has an upper portion located in the annular STI structure and through the annular STI structure.

11. The method according to claim 1, wherein the LDMOS transistor is formed including:
    forming an N-type drift region in the first region of the P-type epitaxial layer,
    forming an STI structure in the N-type drift region, wherein the gate structure covers a portion of the P-type epitaxial layer, a portion of the STI structure, a portion of the N-type drift region between the P-type epitaxial layer and the STI structure,
    forming a source region in the P-type epitaxial layer on one side of the gate structure, and
    forming a drain region in the N-type drift region on an other side of the gate structure.

12. An LDMOS device, comprising:
    a P-type substrate;
    an N-type buried isolation region disposed in the P-type substrate;
    a P-type epitaxial layer disposed over the P-type substrate, the P-type epitaxial layer including a first region and a second region,
        wherein the first region is positioned above the N-type buried isolation region, and the second region surrounds the first region,
        wherein the second region of the P-type epitaxial layer includes an annular groove, and
        wherein the annular groove surrounds the first region of the P-type epitaxial layer and exposes a surface of the N-type buried isolation region at a bottom of the annular groove;
    isolation layers disposed on both sidewalls of the annular groove;
    an annular conductive plug in the annular groove between the isolation layers, wherein the annular conductive plug is in contact with the N-type buried isolation region at the bottom of the annular conductive plug; and
    a gate structure of an LDMOS transistor disposed over the first region of the P-type epitaxial layer.

13. The LDMOS device according to claim 12, wherein each of the isolation layers has a thickness ranging from about 500 Å to about 3000 Å and is made of a material including $SiO_2$, SiN, SiON, SiCN, SiC, or a combination thereof.

14. The LDMOS device according to claim 12, wherein the annular conductive plug is made of a material including polysilicon, and wherein the annular conductive plug is N-doped by N-type ions having a concentration of about $1E19$ atom/cm$^3$ to about $5E20$ atom/cm$^3$ in the annular conductive plug.

15. The LDMOS device according to claim 12, wherein the annular groove has a depth ranging from about 3.5 micrometers to about 5.5 micrometers, and a width ranging from about 0.6 micrometer to about 1.2 micrometers.

16. The LDMOS device according to claim 12, wherein the annular groove or the annular conductive plug has a depth portion located in the N-type buried isolation region, the depth portion of the annular groove or the annular conductive plug located in the N-type buried isolation region ranging from about 0.5 micrometer to about 1.0 micrometer.

17. The LDMOS device according to claim 12, wherein the N-type buried isolation region includes N-type ions doped having a concentration ranging from about $1E18$ atom/cm$^3$ to about $1E22$ atom/cm$^3$ in the N-type buried isolation region.

18. The LDMOS device according to claim 12, further including an annular shallow trench isolation (STI) structure disposed in the P-type epitaxial layer on both sides of the annular groove such that the annular groove has an upper portion located in the annular STI structure and through the annular STI structure.

19. The LDMOS device according to claim 12, wherein the LDMOS transistor further includes:
- an N-type drift region disposed in the first region of the P-type epitaxial layer,
- an STI structure disposed in the N-type drift region, wherein the gate structure covers a portion of the P-type epitaxial layer, a portion of the STI structure, a portion of the N-type drift region between the P-type epitaxial layer and the STI structure,
- a source region disposed in the P-type epitaxial layer on one side of the gate structure, and
- a drain region disposed in the N-type drift region on other side of the gate structure.

20. The LDMOS device according to claim 12, wherein the first region is positioned exactly above the N-type buried isolation region having a length less than a length of the N-type buried isolation region, such that the bottom of the annular groove in the second region is entirely in contact with the N-type buried isolation region in the P-type substrate.

* * * * *